US008525371B2

(12) United States Patent
Shindo et al.

(10) Patent No.: US 8,525,371 B2
(45) Date of Patent: *Sep. 3, 2013

(54) DISCHARGE CONTROL APPARATUS ARRANGED IN POWER CONVERSION SYSTEM

(75) Inventors: Yusuke Shindo, Nagoya (JP); Tsuneo Maebara, Nagoya (JP); Ryotaro Miura, Aichi-ken (JP)

(73) Assignee: Denso Corporation, Kariya (JP)

( * ) Notice: Subject to any disclaimer, the term of this patent is extended or adjusted under 35 U.S.C. 154(b) by 262 days.

This patent is subject to a terminal disclaimer.

(21) Appl. No.: 13/108,083

(22) Filed: May 16, 2011

(65) Prior Publication Data

US 2011/0278918 A1    Nov. 17, 2011

(30) Foreign Application Priority Data

May 14, 2010  (JP) ................................. 2010-112010

(51) Int. Cl.
*H02M 3/06* (2006.01)
(52) U.S. Cl.
USPC ......................................................... 307/109
(58) Field of Classification Search
USPC ......................................................... 307/109
See application file for complete search history.

(56) References Cited

U.S. PATENT DOCUMENTS 8,362,754 B2 *  1/2013  Maebara et al. .............. 323/282

FOREIGN PATENT DOCUMENTS

| JP | H07-031162 | 1/1995 |
| JP | 3289567 | 3/2002 |
| JP | P2003-111432 A | 4/2003 |
| JP | P2003-348856 A | 12/2003 |
| JP | P2009-177883 A | 8/2009 |

OTHER PUBLICATIONS

Fukuta et al, U.S. Appl. No. 12/899,777, filed Oct. 7, 2010.
Maebara et al, U.S. Appl. No. 13/043,815, filed Mar. 9, 2011.

* cited by examiner

*Primary Examiner* — Robert L. Deberadinis
(74) *Attorney, Agent, or Firm* — Nixon & Vanderhye PC

(57) ABSTRACT

A discharge control apparatus arranged in a power conversion system having high-side switching element and low-side switching element to convert the DC power from the battery to a predetermined type of power. The discharge control is performed to discharge a capacitor connected in parallel to the switching elements when an abnormal event occurs. The discharge control apparatus is configured to simulate the operation of the switching elements assuming occurrence of the abnormal event, and transmits a plurality of signals representing the simulation result to a control device via a common photocoupler that isolates the switching elements side and the control device side. The control device diagnoses whether or not a fault occurs in the discharge control or the like by the simulation result.

11 Claims, 6 Drawing Sheets

DISCHARGE CONTROL APPARATUS ARRANGED IN POWER CONVERSION SYSTEM

CROSS REFERENCE TO RELATED APPLICATION

This application is based on and claims the benefit of priority from earlier Japanese Patent Application No. 2010-112010 filed on May 14, 2010 the description of which is incorporated herein by reference.

TECHNICAL BACKGROUND

1. Field of the Invention

The present invention relates to power systems and, more particularly to a discharge control apparatus arranged in a power conversion system.

2. Description of the Related Art

Conventionally, various types of power systems have been provided. For instance, a Japanese Patent No. 3289567 discloses a power system including a motor connected to an inverter unit in which a capacitor is connected between a pair of input terminals. The power system further includes a control unit which is adapted to control a discharging of the capacitor. Particularly, the control unit controls switching elements of the inverter unit such that the torque of the motor becomes approximately zero and reactive current flows through the motor. As a result, electric charge in the capacitor can be discharged (referred to discharging control).

In the discharge control, assuming the control unit operates the switching elements of the inverter unit differently from when the motor so is controlled normally (hereinafter refers to normal operation), the discharging control would not be used for normal operation. In other word, while it is in normal operation and the inverter unit is driven properly, the discharge control may not be performed correctly. Therefore, in this case, there is a concern that the control unit cannot perform the discharge control even if the discharge control is required.

SUMMARY

An embodiment provides a discharge control apparatus adapted to a power conversion system in which abnormalities in the discharge control can be reliably diagnosed.

Hereinafter will be described a detail configuration of the discharge control apparatus and its advantages.

The discharge control apparatus according to a first aspect of the embodiment is included in a power conversion system. The power conversion system includes: a DC power source outputting DC power; power conversion circuit provided with series-connected switching elements including a high-side switching element and a low-side switching element for converting the DC power into a predetermined type of power to be used by an electric device; a capacitor connected between the DC power source and the power conversion circuit; a switching circuit adapted to switch a conduction path between the DC power source and, the power conversion circuit and the capacitor, to be opened or closed; and first monitoring means for monitoring a state of the switching elements and outputting a signal concerning the state of the switching elements while the power conversion circuit is converting the DC power into the predetermined power. The discharge control apparatus includes: discharge control means for controlling a charging voltage of the capacitor to be less than or equal to a predetermined voltage such that when the conduction path is opened by the switching circuit, both of the high-side switching element and the low-side switching element are operated to be turned on whereby both electrodes of the capacitor are short-circuit to discharge the capacitor; second monitoring means for monitoring the state of the switching elements and outputting the signal concerning the state of the switching elements, while the switching elements are operated in the same way as the discharge control means operates the switching elements; diagnostic means for diagnosing the switching elements and the discharge control means whether or not a fault occurs in the switching elements and the discharge control means based on the signals outputted by the first and second monitoring means; and transmitting means for transmitting the signals outputted from the first monitoring means and the second monitoring means to the diagnostic means, the first and second transmitting means and the diagnostic means are electrically isolated by the transmitting means.

According to the above-described apparatus, the second monitoring means, transmitting means and the diagnostic means are provided. Therefore, based on a signal representing the state caused by a behavior of the switching elements when the switching elements are operated by the same procedure of the discharge control means, the discharge control can be diagnosed (whether or not a fault has occurred in the discharge control) properly. Moreover, a regular transmitting means which is usually mounted on the power conversion system and is used for transmitting a state of the switching elements to the diagnostic means, and a transmitting means used for transmitting the above-described state caused by the behavior of the switching elements, are combined to be shared by the both transmitting means. Accordingly, it is not necessary to add a new transmitting means for diagnosing the discharge control. As a result, the number of components necessary for diagnosing the discharge control can be suppressed and also, the power conversion system can be shrunk in its size. As a result, cost reduction of the manufacturing the system can be achieved as well. Furthermore, since the diagnostic means is adapted to diagnose both the switching elements based on the output signal from the first monitoring means and the discharge control based on the second monitoring procedure, the diagnostic means can recognize when the signals from the respective monitoring means are transmitted. Therefore, the diagnostic means can recognize, based on the signals via the transmitting means, whether the fault is caused by the switching element or the discharge control.

According to a second aspect of the embodiment, the second monitoring means is configured to simulate an operation of the switching element which is operated by the discharge control means and to output a signal concerning the state of the switching elements to be simulated.

The discharge control apparatus according to the second aspect of the embodiment, it is diagnosed whether or not a fault occurs in the discharge control based on the signal concerning the state of the switching elements when the above-described operation of the switching element is simulated. Therefore, it is diagnosed whether or not a fault occurs in the discharge control without detecting the capacitor being actually discharged or not.

According to a third aspect of the embodiment, the transmitting means is configured by a photocoupler.

By using the photocoupler as the transmitting means, the circuit configuration used for transmitting the signals outputted by the first and second monitoring means to the diagnostic means can be simplified.

According to a fourth aspect of the embodiment, the first monitoring means is configured to output a signal representing whether or not a fault occurs in the switching elements, the second monitoring means is configured to output a signal representing whether or not a fault occurs in a procedure performed by the discharge controlling means, and the photocoupler is configured such that a signal representing an occurrence of a fault in the switching element and a signal representing an occurrence of a fault in the procedure performed by the discharge controlling means are transmitted to the diagnostic means by preventing the photo diode of the photocoupler from emitting.

According to the fourth aspect of the embodiment, the signals representing the occurrence of the fault are transmitted to the diagnostic means with the above-described configuration. Hence, even if the photo diode of the photocoupler is degrading (e.g. cannot emit sufficiently) due to aging or the like, the diagnostic means can diagnose the occurrence of the fault in either the switching element or the discharge control.

According to a fifth aspect of the embodiment, the first monitoring means is configured to output a signal representing whether in or not a fault occurs in the switching elements, the second monitoring means is configured to output a signal representing whether or not a fault occurs in a procedure performed by the discharge controlling means, and the photocoupler is configured such that the signal representing an occurrence of the fault in the switching element and a signal representing an occurrence of the fault in the procedure performed by the discharge controlling means are transmitted to the diagnostic means by getting the photo diode of the photocoupler emitted.

According to the above-described fifth aspect of the embodiment, the photo diode does not emit while no fault is detected in the switching elements or the discharge control. Therefore, the lifetime of the photo coupler can be extended.

According to a sixth aspect of the embodiment, the power conversion system is mounted on a vehicle and further includes determining means for determining whether or not an abnormality occurs in the vehicle. The discharge control means of the discharge control apparatus is configured to short-circuit the electrodes of the capacitor to discharge the capacitor.

In the above-described embodiments, the discharge control is not executed until an abnormality of the vehicle is detected so that frequency of the discharge control is low. Therefore, the number of components necessary for diagnosing the discharge control is lowered. Accordingly, in the embodiments as described above, it is a significant advantage that the signal outputted by the first monitoring means and the signal outputted by the second outputting means are transmitted to the diagnostic means by the common transmitting means.

BRIEF DESCRIPTION OF THE DRAWINGS

In the accompanying drawings:

FIGS. 4A, 4B, 4C and 4D are timing charts showing gate voltage to be applied when it is in the abnormal situation according to the first embodiment;

DETAILED DESCRIPTION OF THE PREFERRED EMBODIMENTS (First Embodiment)

With reference to drawings FIGS. 1, 2A to 2C, 3A to 3C, 4A to 4D and 5 to 7, hereinafter will be described a discharge control apparatus of a power conversion system which is adapted to a hybrid electric vehicles according to a first embodiment of the present invention.

Figure 1:
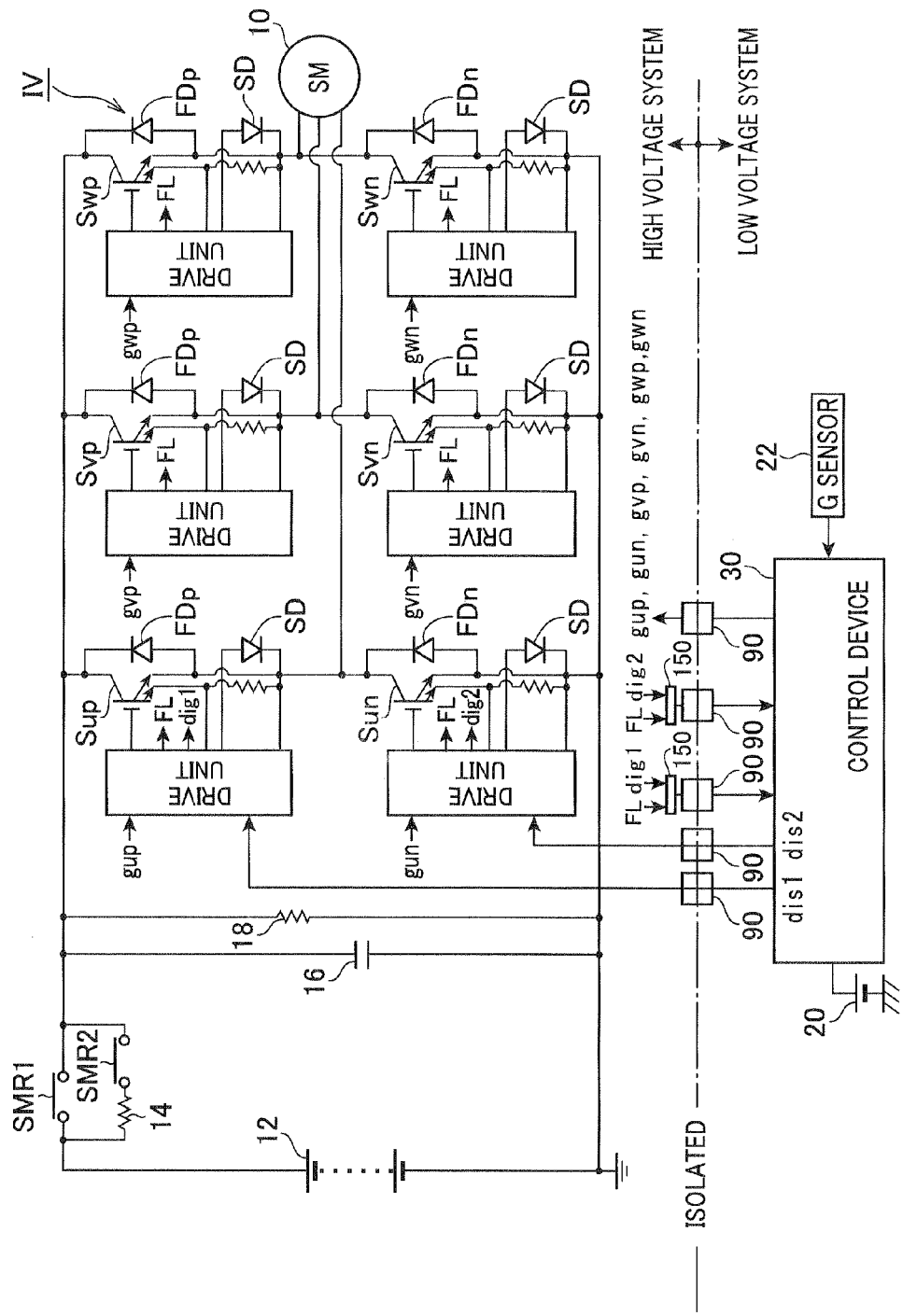
FIG. 1 is a system configuration according to a first embodiment of the present invention.

FIG. 1 is a system configuration according to a first embodiment of the present invention. A motor generator 10 as shown in FIG. 1 is a main equipment of the vehicle and is mechanically connected to a drive wheel (not shown). Further, the motor generator 10 is connected to a high voltage battery 12 via an inverter IV (power conversion circuit) and a parallel-connected circuit block having a relay SMR2 with a resistor 14 and a relay SMR1 which are connected in parallel. As to the high voltage battery 12, the terminal voltage exceeds e.g. more than 100 V. Also, a capacitor 16 and a discharge resistor 18 are disposed closer to the inverter IV side than the circuit block consisting of the relay SMR2 and SMR1. The capacitor 16 and the discharge resistor 18 are connected in parallel to the input terminal of the inverter IV. It is noted that the relays SMR 1 and SMR 2 corresponds to a switching circuit.

The inverter IV constitutes three series-connected circuit blocks each having a high-side switching element Sjp (j=u, v, w) and a low-side switching element Sjn as power elements. The three series-connected circuit blocks are connected in parallel each other. The respective connection points between the high-side switching element Sjp and the low-side switching element Sjn are connected to each phase of the motor generator 10. The high voltage battery 12 operates as a direct current (DC) power source in the power conversion system and the inverter IV is configured to convert the DC power to a predetermined type of power (e.g. alternating current (AC) power).

Above-described high-side switching element Sjp and the low-side switching element Sjn have freewheel diodes FDp and FDn respectively such that the cathode and anode terminals of the freewheel diode are connected between the input terminal and the output terminal (between collector-emitter terminals) of the respective switching elements. The above-described switching elements Sjp and Sjn are voltage-controlled type switching element, i.e., Insulated Gate Bipolar Transistor (IGBT).

Meanwhile, a control device 30 is an electronic control unit powered by a low voltage battery 20. The control device 30 is configured to operate the inverter IV so as to control the motor generator 10 as a control object. Specifically, based on signals detected by various sensors (not shown), the control device 30 generates operation signals gjp and gjn for operating the high-side switching elements and the low-side switching elements respectively, where each of the switching elements corresponds to U-phase, V-phase and W-phase of the inverter IV, and outputs the operation signals. Therefore, the control device 30 operates the respective switching elements Sjp and Sjn via drive units (DU) connected to the gate terminals of the switching elements. Moreover, the control device 30 generates discharge command signals dis1 and dis2 and outputs the command signals to drive units DUs which correspond to the U-phase switching elements Sup and Sun, respectively. The discharge command signals dis1 and dis2 are used for forcibly discharging the capacitor 16 when a collision event of the own vehicle is detected (i.e., abnormal situation/abnormal event) based on an acceleration value detected by an acceleration sensor (gravity(G) sensor 22) which can detect the acceleration force applied to the control device itself. The control device 30 corresponds to diagnostic means.

As shown in FIG. 1, a high voltage system including the inverter IV and a low voltage system including the control device 30 are electrically isolated by a photocoupler 90 or the like. Therefore, the above-described operation signal gj# (j=u, v, w, #=p, n) and the discharge command signals dis1 and dis2 are outputted to the high voltage system via the photocoupler 90 or the like. The operation signal gjp (j=u, v, w, #=p, n) and the operation signal 'gjn' are configured to turn on alternately as complementary signals. The photocoupler corresponds to transmitting means.

Figure 2A:
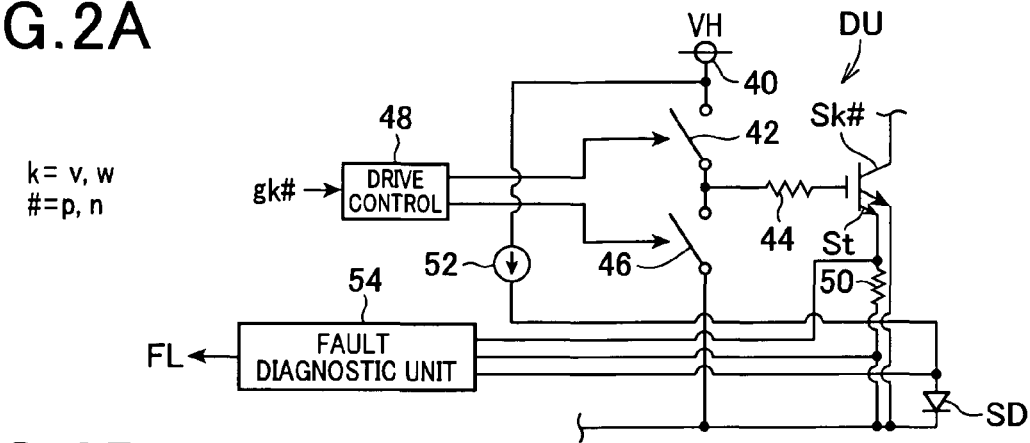
FIGS. 2A, 2B and 2C are circuit diagrams each showing a drive unit (DU) according to the embodiment according to the first embodiment.
Figure 2B:
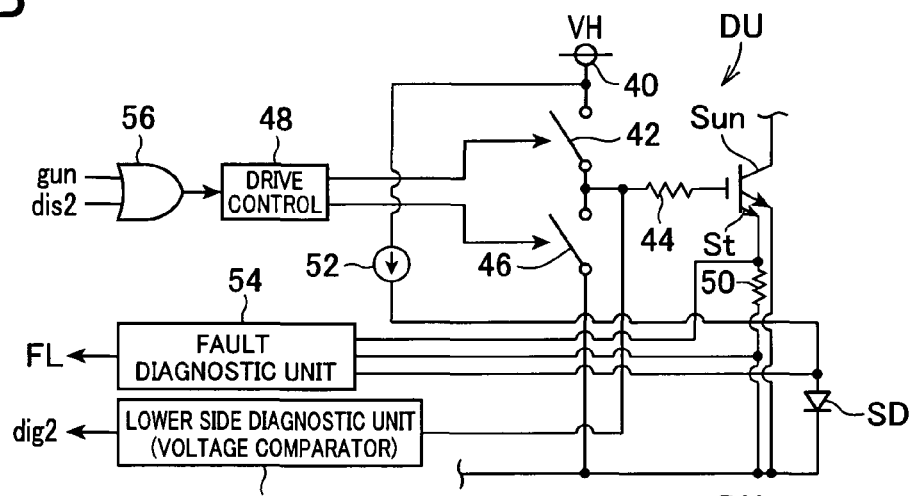
Figure 2C:
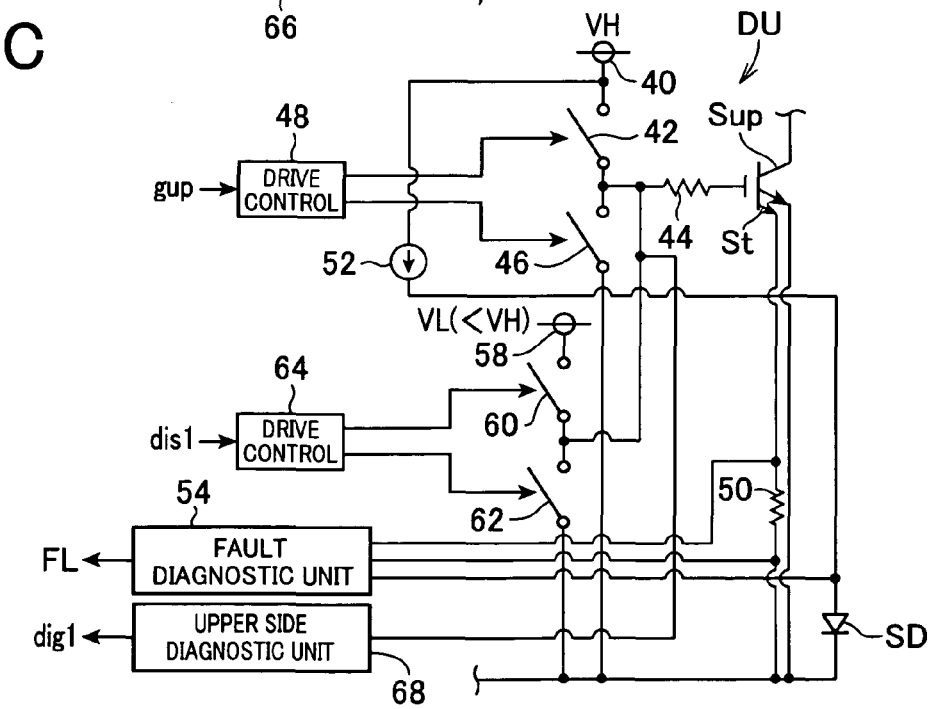

FIGS. 2A, 2B and 2C are circuit diagrams showing configurations of the drive unit (DU), particularly for driving the switching elements sj# to be on and off. Specifically, FIG. 2A shows a configuration of the drive unit DU for driving V-phase and W-phase of the motor generator 10, FIG. 2B shows a configuration of the drive unit DU for driving the lower arm of the U-phase (U-phase lower arm) and FIG. 2C shows the drive unit DU for driving the upper arm of the U-phase (U-phase upper arm).

As shown in FIG. 2A, the drive unit DU for driving the V-phase and the W-phase includes a power supply 40 having terminal voltage VH. The voltage VH of the power supply 40 is applied to the gate terminal of the switching element sk# (k=v, w) via a switching element 42 used for charging, a gate resistor 44. The gate terminal of the switching element sk# is connected to the output terminal (emitter) of the switching element via a gate resistor 44 and a switching element 46 used for discharging, whereby the discharging path of the gate is formed. The switching element 42 used for charging and the switching element 46 used for discharging are controlled to be on and off based on the operation signal gk# (k=v, w) by a drive control block 48 used for normal operation. The normal operation is an operation where the power is converted to the predetermined type of power under normal situation, that is, no abnormal event is detected. As a result, the switching element sw# is on/off controlled by the drive control block 47 for normal operation.

Above-described switching element sk# includes a sense terminal St which outputs a small current (sense current) having a correlation with a current flowing between the input terminal and the output terminal of the switching element. The small current outputted from the sense terminal St is flowing through a shunt resistor 50.

A temperature sensing diode SD to detect the temperature at the switching element sk# is disposed closely to the switching element sk#. In more detail, the cathode terminal of the temperature sensing diode SD is connected to the emitter terminal of the switching element sk#, and the anode terminal 40 is connected to the output terminal of the constant current circuit 52 being power-supplied by the power supply 40. It is noted that there is negative correlation between the output voltage of the temperature sensing diode SD and the temperature to be detected.

A state of the switching elements such as amount of current-flowing, temperature thereof are monitored such that the voltage drop at the shunt resistor 50 caused by the above-described small current and the voltage at the anode terminal of the temperature sensing diode SD are monitored by a fault diagnostic unit 54 (first monitoring means). Based on the state of the switching element, such as an amount of the voltage drop at the shunt resistor 50, when it is determined that the current flowing between the input terminal and the output terminal of the switching element sk# is larger than or equal to a threshold current value Ith, or when it is determined that the temperature at the switching element is larger than or equal to a predetermined temperature based on the anode voltage of the temperature sensing diode SD, the fault diagnostic unit 54 outputs the failure signal FL which is active High.

As shown in FIG. 2B, the drive unit DU for driving the U-phase lower arm is basically the same configuration as the one shown in Hg. 2A except that an operation signal 'gun' and the discharge command signal dis2 are logical ORed by an OR circuit 56 and the ORed signal is inputted to the drive control block 48.

Moreover, as shown in FIG. 2C, the drive unit DU for driving U-phase upper arm includes a dedicated circuit block in addition to the configuration as shown in FIG. 2A. The dedicated circuit block is configured to control the switching element Sup to be on and off. In this circuit configuration, a power supply 58 having terminal voltage VL lower than higher terminal voltage VH, is applied to the gate of the switching element Sup via a switching element 60 used for charging and a gate resistor 44. The gate is connected to the emitter terminal of the switching element Sup via the gate resistor 44 and a switching element 62 used for discharging. The switching element 60 used for charging and the switching element 62 used for discharging are controlled to be on and off by an extraordinary drive control block 64 in response to the discharge command signal dis1. As a result, the switching element Sup is controlled to be on and off in response to the discharge command signal dis1.

Figure 3A:
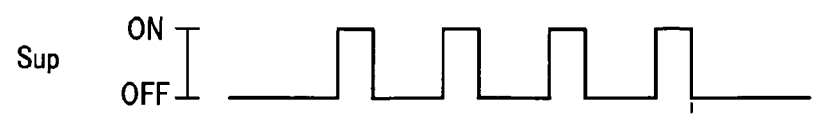
FIGS. 3A, 3B and 3C are timing diagrams showing a discharge control when it is in an abnormal situation according to the first embodiment.
Figure 3B:
Figure 3C:
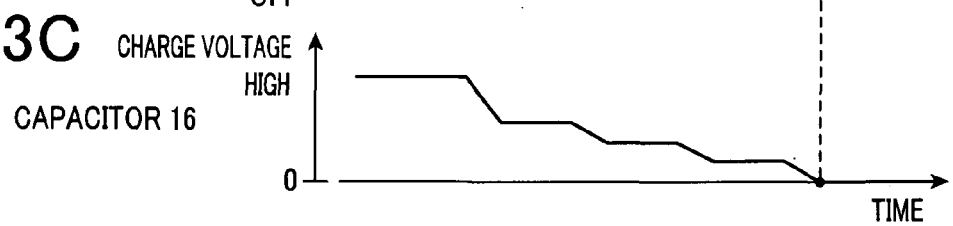

FIGS. 3A, 3B and 3C are timing diagrams showing a discharge control based on the discharge command signals dis1 and dis2. In particular, FIG. 3B shows a status change of the high-side switching element Sup used for the U-phase, FIG. 3B shows a status change of the low-side switching element Sun used for the U-phase and FIG. 3C shows a change of the charging voltage of the capacitor 16.

As shown in FIGS. 3A to 3C, according to the embodiment, the state of the high-side switching element Sup is periodically changed between on and off while the state of the low-side switching element Sun used for U-phase is kept on-state. Therefore, the high-side switching element Sup and the low-side switching element Sun turn on simultaneously for a constant period where both electrodes of the capacitor 16 are short-circuited by the switching elements Sup and Sun. As a result, the capacitor 16 is discharged. The period of on-time per switching for the switching elements Sup and Sun determine the heating value of the switching elements Sup and Sun. Therefore, to avoid excessive temperature rise by the heat generation of the switching elements Sup and Sun, the period of the on-time is appropriately set. Also, the period of off time determines the rate of temperature rise of the switching elements Sup and Sun. Hence, the period of off-time per switching is set to avoid the rate of temperature rise being excessively high.

Figure 4A:
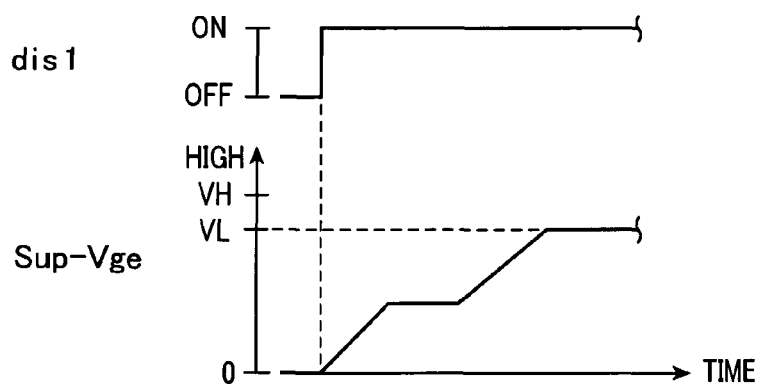
Figure 4C:
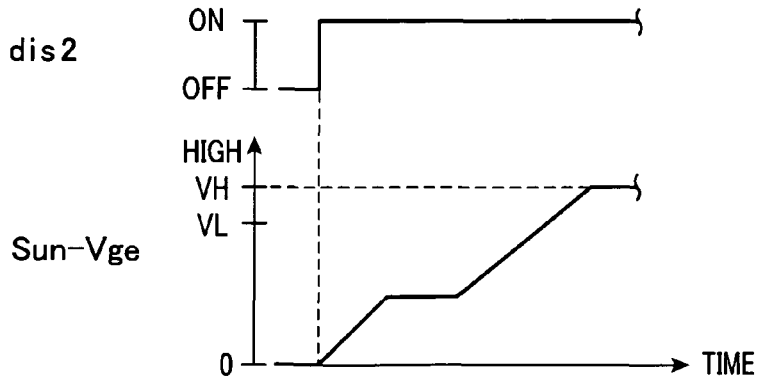

As shown in FIGS. 4A to 4D, the gate voltage of the high-side switching element Sup is lower than the gate voltage of the low-side switching element Sun due to the circuit configuration of the drive unit DU as shown in FIGS. 2A to 2C. Here, FIG. 4A shows a change of the discharge command signal dis1 transmitted to the high-side switching element Sup of the U-phase, the FIG. 4B shows a change of the gate-emitter voltage Vge of the high-side switching element Sup, the FIG. 4C shows a change of the discharge command signal dis2 transmitted to the low-side switching element Sun of the U-phase and the FIG. 4D shows a change of the gate-emitter voltage Vge of the low-side switching element Sun.

According to the configuration as described above, the high-side switching element Sup is driven in the unsaturated region and the low-side switching element Sun is driven in the saturated region. This is because the gate voltage applied to the low-side switching element Sun is lower than that of the high-side switching element Sup so that the current flowing in the unsaturated region of the high-side switching element Sup becomes lower than that of the low-side switching element Sun. As a result, the amount of current flowing through the high-side switching element Sup and the low-side switching element Sun is Limited to the current flowing in the unsaturated region of the high-side switching element Sup by the discharging control. Moreover, the amount of current flowing through the high-side switching element Sup and the low-side switching element Sun can be Limited, when limiting the period of turn-on time per switching of the high-side switching element, by controlling the high-side switching element Sup to be on and off in multiple times.

The amount of current in the unsaturated region of the high-side switching element Sup may preferably be set to be less than a threshold current Ith which is defined by the above-described drive unit DU. The terminal voltage VH is used for the threshold current Ith to be in the saturated region. That is, when the motor generator 10 is controlled in which the power of the high voltage battery 12 is converted into a predetermined type of power by the inverter IV, the switching elements Sup and Sun are driven in the saturated region.

Figure 5:
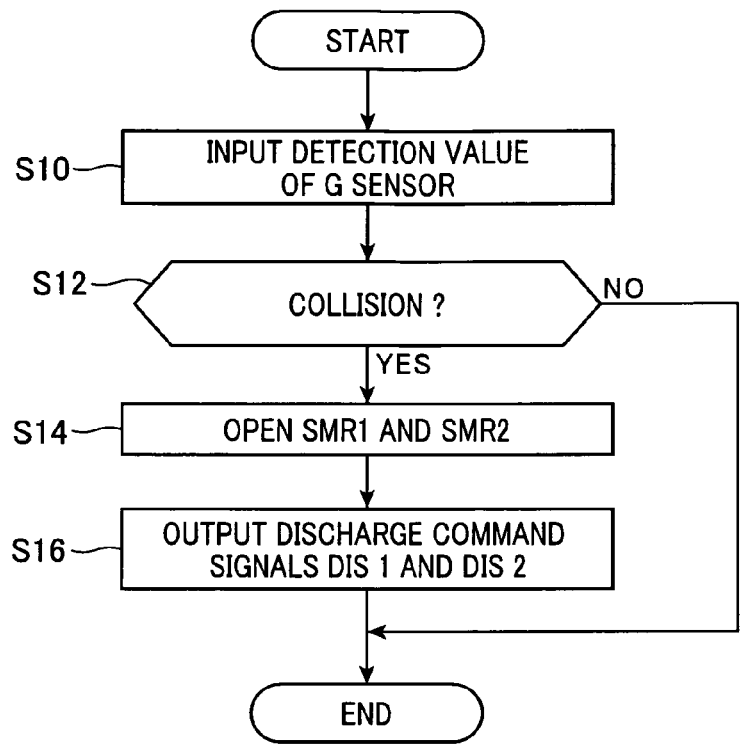
FIG. 5 is a flowchart showing a procedure of the discharge control when it is in the abnormal situation according to the first embodiment.

FIG. 5 shows a procedure of the discharge control when it is in an abnormal situation according to the first embodiment. This procedure is repeatedly executed by the control device 30 e.g. executed for a predetermined period.

In the series of procedure, at step S10, detected value of the G sensor 22 is inputted to the control device 30. Subsequently at step 12, it is determined (determining means) whether or not a collision of the own vehicle occurs based on the inputted detected value. The collision is determined when the detected acceleration is larger than or equal to a predetermined value. When a collision of the own vehicle is determined, at step 14, relays SMR1 and SMR2 are opened. At step 16, the control device 30 outputs the discharge command signals dis1 and dis2. The series of procedure is terminated when the procedure of the step S16 completes or when the determination at step 12 is No. The relays SMR1 and SMR 2 are adapted to switch the conduction path between the high voltage battery 12 and the inverter IV (the capacitor 16) to be opened or closed.

The discharge control in the abnormal situation is not employed as long as the abnormal event i.e., collision of the own vehicle has never been detected. It is not determined whether or not the discharge control is reliably performed in the abnormal situation by whether or not the motor generator 10 is controlled normally. This is because the discharge command signals dis1/dis2 are independent from the operation signals gup/gun and the drive circuit used in an abnormal situation is different from the one used when the motor generator 10 is being controlled normally Therefore, according to the embodiment, the discharge control in the abnormal situation is simulated assuming the capacitor 16 has no charge and the charging voltage of the capacitor 16 is expected to be zero. This simulation is to confirm whether or not the discharge control of the abnormal situation is executable by using a diagnostic unit disposed in the drive unit DU of the U-phase lower arm (lower-side diagnostic unit 66) as shown in FIG. 2B and a diagnostic unit disposed in the drive unit DU of the U-phase upper arm (upper-side diagnostic unit 68) as shown in FIG. 2C. The lower-side diagnostic unit 66 and the upper-side diagnostic unit 68 correspond to second monitoring means.

As shown in FIG. 2B, the lower-side diagnostic unit 66 is configured to acquire voltage at an electrical path having the same electrical potential as the gate voltage of the switching element Sun and determines whether or not the acquired voltage is within a tolerance range (i.e., an error against the terminal voltage VH of the power supply 40 is less than or equal to the predetermined threshold value). Then, the lower-side diagnostic unit 66 outputs the determination result as a diagnostic signal dig2. Specifically, when the acquired voltage is within the tolerance range, the lower-side diagnostic unit outputs the diagnostic signal dig2 having voltage corresponding to the logical Low, and when the acquired voltage is not within the tolerance range, the lower-side diagnostic unit outputs the diagnostic signal dig2 having voltage corresponding to the logical High.

Figure 6:
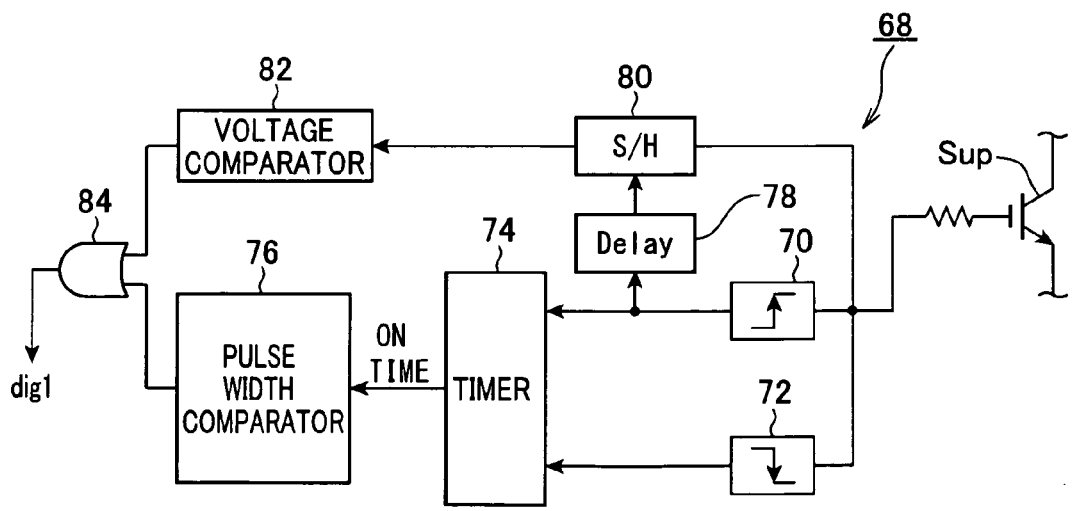
FIG. 6 is a block diagram showing a configuration of a diagnostic unit adapted to an upper arm portion of the U-phase according to the first embodiment.

Meanwhile, as shown in FIG. 6, the upper-side diagnostic unit 68 includes a rising-edge detection block 70 that detects the rising edge of the gate voltage of the switching element Sup and a falling-edge detection block 72 that detects the falling edge of the gate voltage of the switching element Sup. Also, the upper-side diagnostic unit 68 includes a timer 74 that counts a period starting from a time when the rising edge detection block to detect the rising edge and ends at a time when the falling edge is detected. Further, the upper-side diagnostic unit 68 includes a pulse-width comparator 76. The pulse-width comparator 76 is configured to determine whether or not the on-time period (period for the switching element Sup being on by the gate voltage thereof) is within a tolerance range (i.e., an error against the on-period of the discharge command signal dis1 is less than or equal to a predetermined threshold value).

Furthermore, the upper-side diagnostic unit 68 includes a delay circuit 78 and a sample hold circuit 80. The delay circuit 78 is configured such that the output signal from the rising-edge detection block 70 is delayed for a predetermined time to output a trigger signal with the predetermined delay time from the timing of the rising edge and the sample hold circuit 80 is configured to hold the detected gate voltage at a time when the trigger signal is outputted by the delay circuit 78. The delay time produced by the delay circuit 78 is set to be a time when the gate voltage reaches the peak value. Then, a voltage comparator 82 included in the upper-side diagnostic unit 68 determines whether or not the voltage held by the sample hold circuit 80 is within a tolerance range (i.e., an error against the terminal voltage VL is less than or equal to a predetermined threshold value).

Subsequently, the comparison result of the voltage comparator 82 and the output of the pulse-width comparator 76 are logically ORed and outputted as a diagnostic signal dig1. The voltage comparator 82 outputs logical Low voltage signal when the above-described held voltage is within the tolerance range. The pulse-width comparator 76 outputs logical Low voltage signal when the above-described on-time period is within the tolerance range. Therefore, the diagnostic signal dig 1 turns to logical High when at least one of the on-time period or the held voltage has a fault.

Figure 7:
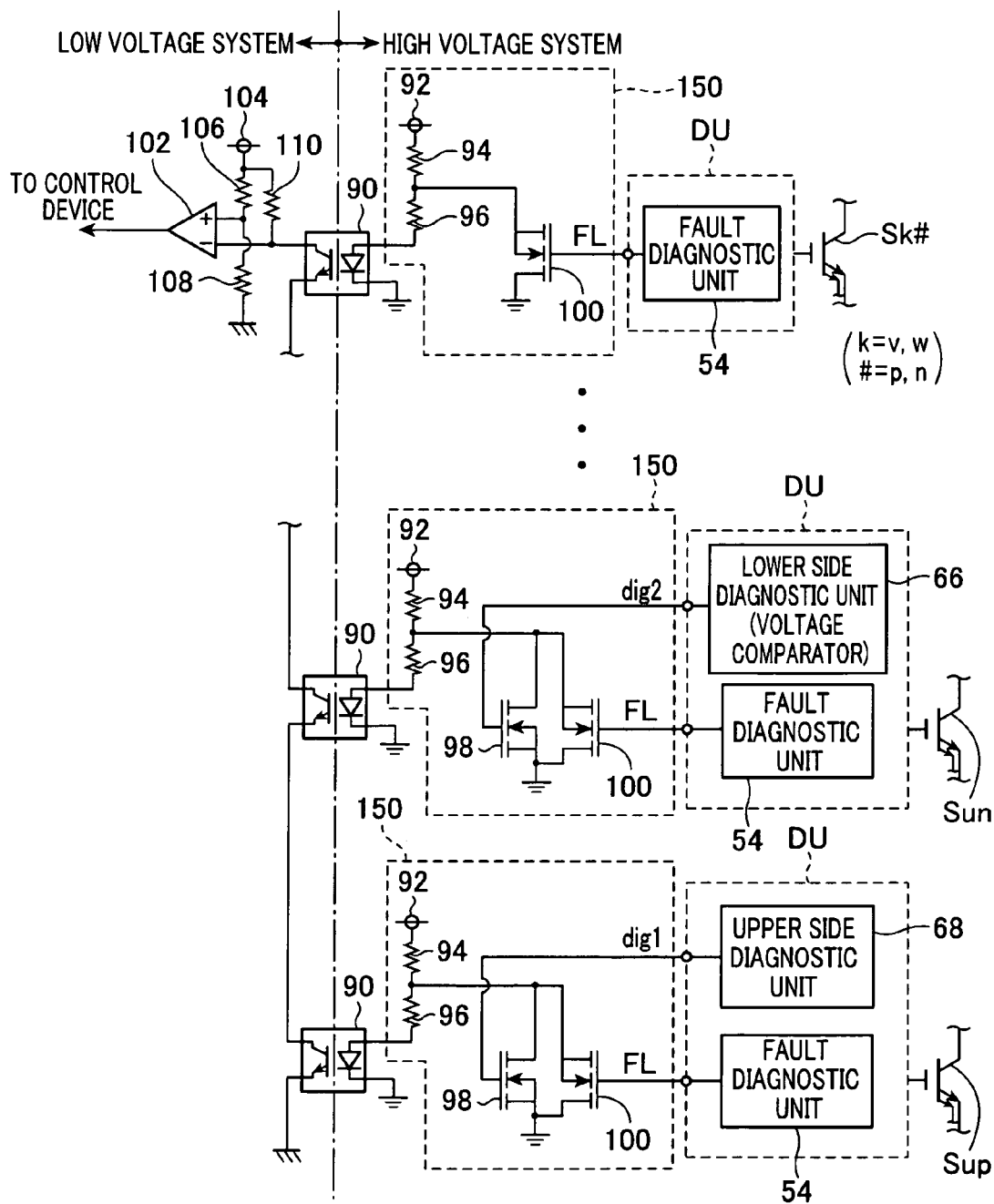
FIG. 7 is a block diagram showing a configuration of a signal transmission circuit designed by using a photocoupler according to the first embodiment.

Next, with reference to FIG. 7, a circuit configuration for transmitting signals to the control device 30 is described. The signals include a failure signal FL from the fault diagnostic unit 54, the diagnostic signal dig2 outputted by the lower-side diagnostic unit 66 and the diagnostic signal dig1 outputted by the upper-side diagnostic unit 68. Since the circuit configurations corresponding to the respective drive units (DUs) for V-phase and U-phase which are used for transmitting FL signal to the control device 30 are equivalent each other, one of configuration between two configurations is described.

As shown in FIG. 7, signals corresponding to the drive unit DU of the U-phase lower arm such as the failure signal FL or the diagnostic signal dig 2 switches the state of the photocoupler 90 corresponding to the drive unit DU between on and off. According to the embodiment, the failure signal FL and the diagnostic signal dig2 are transmitted to the control device 30 via a photocoupler 90 which is commonly used for signals FL and dig2.

Specifically, a low voltage power supply 92 is connected to one end of resistors 94 and 96 which are connected in series and the other end of the series-connected resistors is connected to the ground via the primary side of the photocoupler 90. The junction point of the resistors 94 and 96 is connected to one end of the parallel-connected switching elements 98 and 100. The other end of the parallel-connected switching elements is grounded.

The switching elements 98 and 100 are configured by N-channel type MOSFET (Metal oxide semiconductor field effect transistor) and each of the drain terminals is connected to the junction point of the resistors 94 and 96 and the source terminals are grounded. The gate terminals of the switching elements 98 and 100 are configured to input the diagnostic signal dig 2 outputted by the lower-side diagnostic unit 66 and the failure signal FL outputted by the fault diagnostic unit 54 respectively. The switching elements 98 and 100 and the resistors 94 and 96 configures an interface circuit block 150 which is connected to the photocoupler 90. Similarly, switching element 100 and the resistors 94 and 96 configures the interface circuit 150 as well.

In this configuration, when it is in normal operation in which the diagnostic signal dig2 is not logical High and the failure signal FL is not active, the switching element 98 and 100 are turned off, the current from the low voltage power supply 92 flows through a photo diode included in the photocoupler 90 so as to allow the photo diode to emit light and turn on. Meanwhile, when it is in the abnormal situation where at least one of the diagnostic signal dig2 or the failure signal FL is active, the switching element corresponding to the active signal among the switching elements 98 and 100 becomes in the on-state. Hence, the current flows through the switching element which is on-state via the low voltage power supply 92 and the resistor 94.

Since the current does not flow through the photodiode of the photocoupler 9D, the photo diode does not emit so that the photocoupler 90 remain in the off state. Regarding the failure signal FL and the diagnostic signal dig1 each corresponding to the U-phase upper arm, similar configuration of the U-phase lower arm can be used to switch the on/off state of the photocoupler 90 corresponding to the drive unit DU of the upper arm. As to the configurations of the V-phase and the W-phase, the switching element 98 is not provided because no diagnostic signals dig1 and dig2 exists. However, the configuration for transmitting the failure signal FL is the same as the one of the U-phase.

The secondary side of the photocouplers 90 (photo transistor) each corresponds to one of the six drive unit DUs are series-connected with each other. The emitter terminals of the series-connected photo transistors are connected to the ground and the collector terminals are connected to the inverting input terminal of the comparator 102. The non-inverting input terminal of the comparator 102 is connected to the voltage divider consisting of resistors 106 and 108 which divide the voltage at the low voltage power supply 104. Moreover, the low voltage power supply 104 is connected to the above-described inverting-input terminal via the resistor 110.

According to the above-described configuration, when it is in normal operation where failure signal FL is not outputted by the fault diagnostic units 54 corresponding to respective switching elements Sj# (j=u, v, w, #=p, n) and no active diagnostic signals dial or dig2 (High active signal) are outputted by the upper diagnostic unit 68 and the so lower diagnostic unit 66, the inverting input terminal of the comparator 102 is grounded so that the output signal of the comparator 102 turns to logical High. On the other hand, when it is in an abnormal situation where at least one failure signal FL from among the fault diagnostic units 54 that correspond to the respective switching elements Sj# is active or, either diagnostic signal dig1 or dig2 from the upper-side diagnostic unit 68 and the lower-side diagnostic unit 66 is active, at least one of photocoupler 90 among the series-connected photo couplers 90 turns off. Therefore, the voltage at the inverting input terminal of the comparator 102 becomes larger than the voltage at the non-inverting input terminal of the comparator 102 so that the output signal of the comparator 102 turns to logical Low.

The output signal of the comparator 102 is outputted to the Control device 30. The control device 30 is configured to diagnose whether or not possible abnormalities such as over current flowing through the switching elements Sj# or abnormality of the discharge control has occurred. Specifically, the failure signal FL is transmitted to the low voltage system side via the photocoupler 90 and when the output signal of the comparator 102 becomes logical Low, the control device 30 determines that failure has occurred at the switching elements sj# and controls the switching element Sj# to be forced off. When the diagnostic signals dig1 and dig2 are transmitted to the low voltage system side via the photocoupler 90 and the output signal of the comparator 102 turns to logical Low, the control device 30 determines that the discharge control of the abnormal situation cannot be performed correctly and executes a notification procedure to notify the user.

According to the embodiment, a fault diagnostic procedure of the discharge control of the abnormal situation is performed such that when the startup switch of the vehicle turns off and the relay SMR1 turns to open from the closed-state, the discharge command signals dis1 and dis2 are outputted. Specifically, the above-described fault diagnostic procedure is performed when the charging voltage of the capacitor 16 is substantially zero due to discharging at the discharge resistor 18 after the relay SMR1 turns to open. Therefore, depending on the fault diagnostic procedure, it is considered that the current does not flow through the switching element Su# so that the failure signal FL is not outputted by the fault diagnostic unit 54. Accordingly, the failure signal FL outputted by the fault diagnostic unit 54 and the diagnostic signal dig1 (dig2) outputted by the upper-side diagnostic unit 68 (lower-side diagnostic unit 66) can be reliably transmitted to the control device 30 via the common photocoupler 90.

The above-described startup switch is used to allow the user to start the vehicle. The startup switch is not limited to switches that require mechanical operations. However, portable wireless equipment that transmits a startup-enabling signal to the vehicle side may be employed. The portable wireless equipment is used such that the startup-enabling signal is received by the vehicle when the user having the wireless equipment approaches to the vehicle.

According to the above-described embodiment, following advantages can be obtained.

(1) The discharge commands dis1 and dis2 are outputted to simulate the operation of the switching elements Sup and Sun by the discharge control of the abnormal situation, whereby the behavior of the switching elements Sup and Sun is detected. Based on the simulated behavior, the fault diagnostic procedure diagnoses whether or not the discharge control when it is in the abnormal situation will have a fault. As a result, without detecting whether or not the capacitor 16 is actually discharged, a fault in the discharge control of the abnormal situation can be diagnosed.

(2) The failure signal FL outputted by the fault diagnostic unit 54 corresponding to the U-phase upper arm (lower arm) and the diagnostic signal dig1 (dig2) outputted by the upper diagnostic unit 68 (lower diagnostic unit 66) are transmitted to the control device 30 via the common photocoupler 90. Hence, a photocoupler dedicated to the fault diagnostic procedure of the discharge control of the abnormal situation is not necessary for transmitting the above-described diagnostic signals to the control device 30. Accordingly, increasing of the number of components necessary for the power conversion system can be preferably suppressed. Moreover, the power conversion system can be shrunk with these features and manufacturing cost can be reduced as well.

(3) The photocoupler 90 is configured such that the photo diode of the photocoupler 90 does not emit light when there is an abnormal situation where at least the failure signal FL or the diagnostic signals dig 1 (dig2) are outputted by the fault diagnostic unit 54 and the upper-side diagnostic unit 68 (lower-side diagnostic unit 66) corresponding to the U-phase upper arm (lower arm). As a result, even when the photo diode included in the photocoupler 90 cannot emit light due to aging or the like, it is diagnosed whether or not a fault occurs at least on the switching element Sj# or the discharge control of the abnormal situation or the photocoupler 90.

(Second Embodiment)

Figure 8:
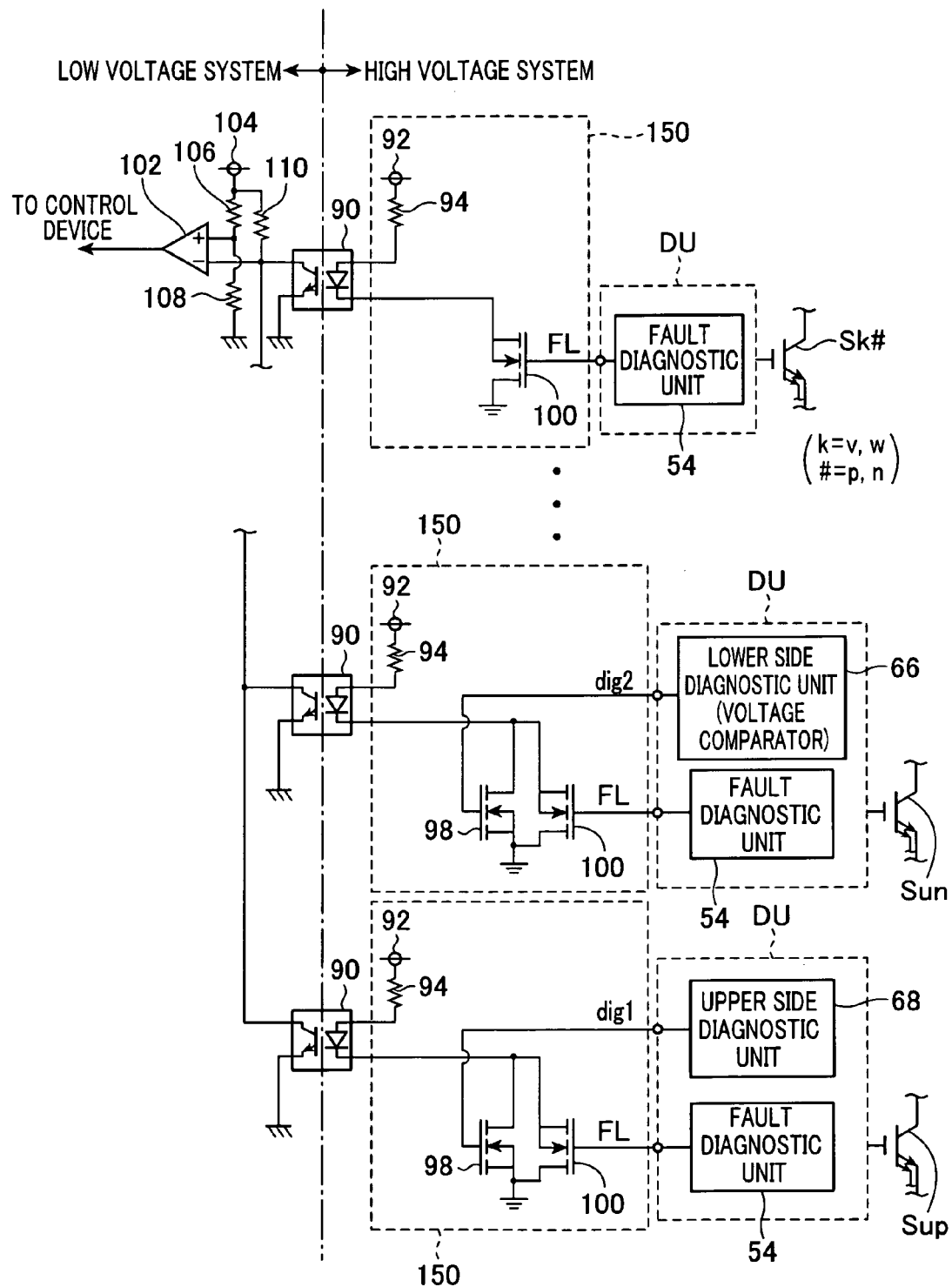
FIG. 8 is a block diagram showing a configuration of a signal transmission circuit designed by using a photocoupler according to a second embodiment.

With reference to FIG. 8, hereinafter will be described a second embodiment of the present invention. In the second embodiment, difference between the above-described first embodiment and the second embodiment is mainly described.

As shown in FIG. 8, a circuit configuration for transmitting signals including the failure signal FL outputted by the fault diagnostic unit 54, the diagnostic signal dig 2 outputted by the lower-side diagnostic unit 66 and the diagnostic signal dig1 outputted by the upper-side diagnostic unit 68, to the control device 30, is described. In FIG. 8, the same components as used in FIG. 7 or the components corresponding to those in FIG. 7 are applied with the same reference numbers.

According to the second embodiment, the photocoupler 90 is configured such that the photo diode included in the photocoupler 90 emits light when it is an abnormal situation where at least the failure signal FL or the diagnostic signals dig1 (dig2) is outputted by the fault diagnostic unit 54 and the upper-side diagnostic unit 68 (lower-side diagnostic unit 66) corresponding to the U-phase upper arm (lower arm). In more detail, regarding the configuration of the drive unit DU of the U-phase lower arm, the low voltage power supply 92 is connected to the anode side of the photo diode included in the photocoupler 90 via the resistor 94. The cathode side of the photo diode is connected to one end of the parallel-connected switching elements 98 and 100 and the other end of the switching elements is connected to the ground.

In this configuration, when it is normal situation where neither the diagnostic signal dig 2 (voltage corresponding to logical High) nor the failure signal FL are outputted, the switching elements 98 and 100 are off and the current does not flow to the photo diode of the photo coupler 90 from the low voltage power supply 92 whereby the photo coupler 90 is off. Meanwhile, when it is in an abnormal situation where at least one of diagnostic signal dig2 (voltage corresponding to logical is High) or the failure signal FL are outputted, either switching element 98 or switching element 100 which corresponds to the output signal is on-state. Therefore, the current flows through the photo diode of the photocoupler 90 and the switching element which is on-state, from the low voltage power supply 92 via the resistor 94 whereby the photo coupler 90 turns on. Regarding the failure signal FL corresponding to the drive unit DU of the U-phase upper arm or the diagnostic signal dig 1, as similar to the configuration of the U-phase lower arm, the photo coupler 90 corresponding to the drive unit DU of the upper arm is switched between on-state and off-state. It is noted that configurations of the V—phase and the W-phase do not include the switching element 98 since the diagnostic signals dig1 and dig2, however, circuit configuration for transmitting the failure signal FL is similar to the one of the U-phase.

The photo transistors of the photocouplers 90 corresponding to these six drive units DUs are connected in parallel each other. The one end of the parallel-connected circuit is connected to the ground and the other ends are connected to the inverting input terminal of the comparator 102.

According to the configuration, when it is in normal operation where the no failure signal FL is outputted by the fault diagnostic units 54 corresponding to respective switching elements Sj# (j=u, v, w, #=p, n) and no active diagnostic signals digs and dig2 (High active signal) is outputted by the upper diagnostic unit 68 and the lower diagnostic unit 66, all of the parallel-connected photocouplers 90 turn to off. Hence, the voltage at the inverting input terminal of the comparator 102 is larger than the voltage at the non-inverting input terminal of the comparator 102 whereby the output signal of the comparator 102 turn to Low. On the other hand, when it is in an abnormal situation where at least one of the failure signal FL from among the fault diagnostic units 54 that correspond to the respective switching elements Sj# is active or, either diagnostic signal dig1 or dig2 from the upper-side diagnostic unit 68 and the lower-side diagnostic unit 66 is active, the inverting input of the comparator 102 is connected to the ground so that the output of the comparator 102 turns to High.

According to the above-described embodiment, the following advantages can be obtained as an alternative of the advantage (3) according to the first embodiment.

(4) The photo diode of the photocoupler 90 is adapted to emit light when there is an abnormal situation where at least the failure signal FL or the diagnostic signals dig1 (dig2) is outputted by the fault diagnostic unit 54 and the upper-side diagnostic unit 68 (lower-side diagnostic unit 66) corresponding to the U-phase upper arm (lower arm). Therefore, since the photo diode of the photocoupler does not emit light unless the fault occurs on the switching element Sj# or the discharge control of the abnormal situation, the lifetime of the photo coupler 90 can be longer.

(Other Embodiment)

Above-described embodiments can be modified as follows.

According to the above-described first embodiment, it is determined whether or not over current flows through the switching elements Sj# based on the small current having a correlation with the current-flowing between the input terminal and the output terminal of the switching elements Sj#. However, it is not limited to this configuration. For instance, the voltage between the collector terminal and the emitter terminal of the switching element Sj# can be used to determine whether or not over current flows through the switching elements Sj#.

According to the above-described embodiments, in the fault diagnostic procedure of the discharge control, the fault diagnostic procedure corresponding to the U-phase upper arm is executed based on the above-described held voltage and on-time. However, the fault diagnostic procedure is not limited to this procedure. For instance, the diagnostic procedure can be executed based on the above-described on-time only. In this case, a signal related to the on-time can be directly transmitted to the control device 30. Specifically, without using the upper-side diagnostic unit 68, the gate terminal of the switching element Sup and the photo diode of the photocoupler 90 are connected and the photo transistor of the photocoupler 90 is connected to the control device 30. The control device 30 is configured to determine whether or not the above-described on-time is within an allowable range.

Further, regarding the transmitting means for transmitting the failure signal FL or diagnostic signals dig1 and dig2 to the low voltage system associated with the isolation between the high voltage system and the low voltage system, it is not limited to the photocoupler 90. However, various components such as a photo MOS relay or any opto-isolated elements may be employed. Further, other than the opto-isolated elements, magnetic isolated elements such as a transformer can be used as well. The circuit configuration for transmitting the failure signal FL to the low voltage system side by using the transformer as a magnetic isolated is described as follows. With reference to FIG. 8, one end of the primary side coil can be connected to the output sides of the fault diagnostic unit 54 and the upper-side diagnostic unit 68 (lower-side diagnostic unit 66), and the other end can be connected to the ground. On the other hand, the secondary side coils are mutually connected in parallel, and one end of the parallel-connected coils is connected to the ground and the other end is connected to a voltage detecting means. Based on the detected value from the voltage detecting means, when it is determined that the current flows through the transformer, the control device 30 can diagnose that a fault has occurred on the switching elements Sj# or the discharge control is in an abnormal situation.

In this regard, when the transformer is used for the transmitting means, information concerning the voltage which is applied to the gate terminal of the switching element Sup can be transmitted directly to the control device 30. Specifically, the gate terminal of the switching element Sup is connected to the primary side coil of the transformer without using of the upper-side diagnostic unit 68.

Further the determining means is not limited to a means that determine based on the detected value of the G sensor 22. For instance, the determination may be made based on a diagnostic result by a diagnostic means for diagnosing a fault occurrence on the power conversion system including a motor generator, an inverter IV and a boost converter CV.

The switching elements Sj# used for the discharge control is not limited to the IGBT device, however, FETs (field effect transistors) such as a power MOS type FET can be used.

According to the above-described embodiments, the discharge control of the abnormal situation is simulated when the charging voltage of the capacitor 16 is estimated to be substantially zero so as to diagnose whether or not a fault exists in the discharge control. However, it is not limited to this configuration. For instance, while the capacitor 16 is slightly charged due to the relay SMR2 being closed for a short period as a result of turning on of the startup switch, the discharge control of the abnormal situation is performed to diagnose whether or not the capacitor 16 is actually discharged. Even in this case, when it is diagnosed whether or not a fault exists in the discharge control such that the discharge current of the capacitor 16 is detected in the drive unit DU, e.g. based on a voltage drop produced at the shunt resistor 50 by the small current, a transmitting means for transmitting the diagnosing result to the control device 30 is required. Therefore, the advantage is that the transmitting means can be shared by a means for transmitting the failure signal FL to the control device 30.

In this regard, if the failure signal FL includes information of the over current event, although it is considered that the over current event is caused either by over current when the discharge control of the abnormal situation is performed, or by the discharge current flowing from the capacitor 16, these causes of the over current may not be difficult to distinguish. However, the problem can be solved by a configuration in which separate power supply units of the drive unit DU are provided separately for when the discharge control is performed and for when it is in the normal operation, and configured to disable generating the failure signal FL by the power supply used for when the discharge control is performed. As a result, even when the transmitting means is shared, the diagnostic result can be transmitted correctly.

According to the above-described embodiment, the photo coupler adapted to transmitting the signal outputted by the fault diagnostic unit 54 to the control device 30 is employed for transmitting the diagnostic signal outputted by the upper-side diagnostic unit 68 (lower-side diagnostic unit 66). However, it is not limited to this configuration. For example, in a configuration of the drive unit DU, a temperature sensing diode SD is used to monitor the temperature of the switching elements and the detected temperature is transmitted to the control device 30 via a photocoupler which is dedicated to the transmitting the temperature. In this configuration, the dedicated photocoupler can be used for transmitting the above-described diagnostic signal.

In the above-described embodiments, the active logic level of the diagnostic signals dig1 and dig2 when fault occurs are the same value (High), however, the active logic level can be changed to active low level. To change the active logic level, in the configuration as shown in FIG. 7, the switching element 98 to be on/off controlled by the upper-side diagnostic unit 68 (lower-side diagnostic unit 66) can be placed between the resistor 96 and the primary side of the photo coupler 90, and the active level of the diagnostic signals dig1 and dig2 can be changed to Low level when the discharge control has a fault. In this case, the photocoupler 90 is in the off state when the diagnostic result of the fault diagnostic procedure is normal and the photocoupler 90 is in the on state when the diagnostic result of the fault diagnostic procedure is abnormal.

As to the vehicle, the vehicle type is not limited to the hybrid electric vehicles, however, the discharge control apparatus may be adapted to the electric vehicle of which the only energy resource is electrical energy stored for the main equipment of the vehicle.

The inverter IV is not limited to one for exchanging the electric power between a rotary machine as a main equipment of the vehicle and the high voltage battery 12. For instance, the inverter IV can be adapted to one for exchanging the electric power between a rotary machine of an air conditioner or the like other than the main equipment and the high voltage battery 12.

The discharge control apparatus is not limited to a power conversion system which is mounted on the vehicle. For instance, the discharge control apparatus can be adapted to a power conversion system installed in houses for converting the electric power of a direct current (DC) power source to the alternating current (AC). In this power conversion system, the abnormal situation may be defined as a situation when an earthquake or the like is detected.

What is claimed is:

1. A discharge control apparatus included in a power conversion system that comprises a DC power source outputting DC power; power conversion circuit provided with a series-connected switching element including a high-side switching element and a low-side switching element for converting the DC power into a predetermined type of power to be used by an electric device; a capacitor connected between the DC power source and the power conversion circuit; a switching circuit adapted to switch a conduction path between the DC power source and, the power conversion circuit and the capacitor, to be opened or closed; and first monitoring means for monitoring a state of the switching elements and outputting a signal concerning the state of the switching elements while the power conversion circuit is converting the DC power into the predetermined power, the discharge control apparatus comprising:

discharge control means for controlling a charging voltage of the capacitor to be less than or equal to a predetermined voltage such that when the conduction path is opened by the switching circuit, both of the high-side switching element and the low-side switching element are operated to be turned on whereby both electrodes of the capacitor are short-circuit to discharge the capacitor;

second monitoring means for monitoring the state of the switching elements and outputting the signal concerning the state of the switching elements, while the switching elements are operated in the same way as the discharge control means operates the switching elements;

diagnostic means for diagnosing the switching elements and the discharge control means whether or not a fault occurs in the switching elements and the discharge control means based on the signals outputted by the first and second monitoring means; and transmitting means for transmitting the signals outputted from the first monitoring means and the second monitoring means to the diagnostic means, the first and second monitoring means and the diagnostic means being electrically isolated by the transmitting means.

2. The discharge control apparatus according to claim 1, wherein the second monitoring means is configured to simulate an operation of the switching element which is operated by the discharge control means and to output a signal concerning the state of the switching elements being simulated.

3. The discharge control apparatus according to claim 2, wherein the transmitting means include a photocoupler.

4. The discharge control apparatus according to claim 2, wherein the power conversion system is mounted on a vehicle and further includes determining means for determining whether or not an abnormality occurs in the vehicle, the discharge control means of the discharge control apparatus is configured to short-circuit the electrodes of the capacitor to discharge the capacitor.

5. The discharge control apparatus according to claim 1, wherein the transmitting means includes a photocoupler.

6. The discharge control apparatus according to claim 5, wherein the first monitoring means is configured to output a signal representing whether or not a fault occurs in the switching elements, the second monitoring means is configured to output a signal representing whether or not a fault occurs in a procedure performed by the discharge controlling means, and the photocoupler is configured such that the signal representing an occurrence of the fault in the switching element and a signal representing an occurrence of the fault in the procedure performed by the discharge controlling means are transmitted to the diagnostic means by preventing the photo diode of the photocoupler from emitting.

7. The discharge control apparatus according to claim 6, wherein the power conversion system is mounted on a vehicle and further includes determining means for determining whether or not an abnormality occurs in the vehicle, the discharge control means of the discharge control apparatus is configured to short-circuit the electrodes of the capacitor to discharge the capacitor.

8. The discharge control apparatus according to claim 5, wherein the first monitoring means is configured to output a signal representing whether or not a fault occurs in the switching elements, the second monitoring means is configured to output a signal representing whether or not a fault occurs in a procedure performed by the discharge controlling means, and the photocoupler is configured such that the signal representing an occurrence of the fault in the switching element and a signal representing an occurrence of the fault in the procedure performed by the discharge controlling means are transmitted to the diagnostic means by emission of the photo diode of the photocoupler.

9. The discharge control apparatus according to claim 8, wherein the power conversion system is mounted on a vehicle and further includes determining means for determining whether or not an abnormality occurs in the vehicle, the discharge control means of the discharge control apparatus is configured to short-circuit the electrodes of the capacitor to discharge the capacitor.

10. The discharge control apparatus according to claim 5, wherein the power conversion system is mounted on a vehicle and further includes determining means for determining whether or not an abnormality occurs in the vehicle, the discharge control means of the discharge control apparatus is configured to short-circuit the electrodes of the capacitor to discharge the capacitor.

11. The discharge control apparatus according to claim 1, wherein the power conversion system is mounted on a vehicle and further includes determining means for determining whether or not an abnormality occurs in the vehicle, the discharge control means of the discharge control apparatus is configured to short-circuit the electrodes of the capacitor to discharge the capacitor.

* * * * *